United States Patent [19]

Sugihara

[11] Patent Number: 4,736,395
[45] Date of Patent: Apr. 5, 1988

[54] LOGIC CIRCUIT HAVING A TEST DATA LOADING FUNCTION

[75] Inventor: Takanori Sugihara, Inagi, Japan

[73] Assignee: Fujitsu Limited, Kanagawa, Japan

[21] Appl. No.: 857,016

[22] Filed: Apr. 29, 1986

[30] Foreign Application Priority Data

May 2, 1985 [JP] Japan .................... 60-94856

[51] Int. Cl.$^4$ .................. H03K 3/037; H03K 19/003; H03K 21/40
[52] U.S. Cl. ........................ 377/29; 377/73; 307/465; 307/291; 307/247.1; 365/201; 365/205
[58] Field of Search ............... 307/445, 465, 242, 243, 307/247 R, 291; 328/152, 154; 365/201, 205; 377/73, 81, 78, 28, 29

[56] References Cited

U.S. PATENT DOCUMENTS

| | | | |
|---|---|---|---|
| 3,714,472 | 1/1973 | Lagemann | 307/247 R |
| 3,878,405 | 4/1975 | Sylvan | 307/247 R |
| 4,277,699 | 7/1981 | Brown et al. | 377/81 |
| 4,396,829 | 8/1983 | Sugihara | 377/73 |
| 4,627,085 | 12/1986 | Yuen | 377/81 |

*Primary Examiner*—John S. Heyman
*Attorney, Agent, or Firm*—Armstrong, Nikaido, Marmelstein & Kubovcik

[57] ABSTRACT

A logic circuit having a test data loading function, comprising at least one J-K flip-flop. Each J-K flip-flop includes a test data latching logic circuit. In response to an enable signal, test data is selected in place of the usual J and K input data to be latched. In a complex logic circuit including such flip-flops, a test can be effected in a short time.

14 Claims, 6 Drawing Sheets

LOGIC CIRCUIT HAVING A TEST DATA LOADING FUNCTION

BACKGROUND OF THE INVENTION (1) Field of the Invention

The present invention relates to a logic circuit having a test data loading function, provided in a semiconductor chip and having a test data input function for testing a logic operation, and more particularly to a J-K flip-flop circuit having a data loading function for carrying out an input of test data other than data input for a usual logic operation.

(2) Description of the Related Art

J-K flip-flops are widely known in the art. These J-K flip-flops are used, for example, in a semiconductor chip of a gate array with a multi-stage connection to form a counter or a shift register. When the number of stages is large, it is not easy to test the counter or the shift register, especially, at the tail stages. For example, to test the m-bit of an n-bit binary counter, test data can reach the m-bit flip-flop only after $2^m$ clocks are applied. When $m=10$, $2^m=1024$ and thus 1024 clocks must be applied. Therefore, to test a logic circuit having a very complex logic, the necessary number of clocks becomes too large and thus a very long time is needed for testing the logic circuit.

If the test data can be loaded at an arbitrary stage of the logic circuit, such an inconvenient long test time will be eliminated.

Therefore, to give a flip-flop a data loading function is especially important for flip-flops used in a logic circuit having a complex logic.

However, if an attempt is made simply to give the J-K flip-flop a data loading function, this will necessitate the use of a complex switching circuit, as later described in more detail.

SUMMARY OF THE INVENTION

The object of the present invention is to provide a logic circuit including a J-K flip-flop with a data loading function, without causing the switching circuits to become complex.

According to the present invention, there is provided a logic circuit having a test data loading function comprising at least one J-K flip-flop. The J-K flip-flop comprises: a first-stage logic circuit having a first input terminal for receiving a first input data, a second input terminal for receiving a second input data, a test data terminal for receiving a test data, an enable terminal for receiving an enable signal, and an output; and a second-stage logic circuit having an input connected to the output of the first-stage logic circuit and further having a clock signal input terminal for receiving a clock signal, a noninverted signal output terminal, and an inverted signal output terminal. The first-stage logic circuit operatively selects, in response to the enable signal applied to the enable terminal, either the test data or the first and second input data, and the selected data is latched in the second-stage logic circuit in response to the clock signal applied to the clock signal terminal.

BRIEF DESCRIPTION OF THE DRAWINGS

The above object and features of the present invention will be more apparent from the following description of the preferred embodiments with reference to the drawings, wherein.

DESCRIPTION OF THE PREFERRED EMBODIMENTS

Before describing the embodiments of the present invention, conventional logic circuits and the problems therein will first be described with reference to FIGS. 10, 11, and 12.

Figure 10:
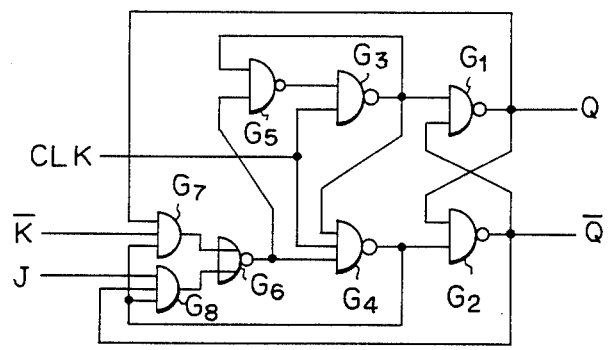
FIG. 10 is a logic circuit diagram illustrating an example of a conventional J-$\overline{K}$ flip-flop.

FIG. 10 shows an example of a conventional J-$\overline{K}$ flip-flop. In FIG. 10, $G_1$ to $G_5$ are NAND gates, $G_6$ is a NOR gate; $G_7$ and $G_8$ are AND gates, J and $\overline{K}$ are inputs; CLK is a clock; and Q and $\overline{Q}$ are outputs. The truth table of this circuit is illustrated in the following table 1; and the symbol marking thereof is illustrated in FIG. 11.

TABLE 1

| J | $\overline{K}$ | $Q_{n+1}$ |
|---|---|---|
| 0 | 0 | 0 |
| 0 | 1 | $Q_n$ (hold) |
| 1 | 0 | $Q_n$ (inverted) |
| 1 | 1 | 1 |

The value of $Q_{n+1}$ is that value existing after a clock is input (after a change from a low level (L) to a high level (H)). $Q_n$ represents the Q output at n clock. $Q_{n+1}$ represents the Q output at n+1 clock. $\overline{Q}_n$ represents an inverted state, i.e., if the prior state is "1", $\overline{Q}_n$ becomes "0"; and if the prior state is "0", $\overline{Q}_n$ becomes 1. The output is determined at the time the clock rises from a low (L) level to a high (H) level. Accordingly, this flip-flop is a positive edge trigger type.

There is a need for the flip-flop to be given a data loading function, as mentioned before.

Figure 11:
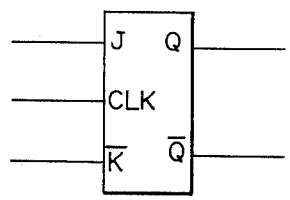
FIG. 11 is a block diagram illustrating a symbol marking of the J-$\overline{K}$ flip-flop shown in FIG. 9.
Figure 12:
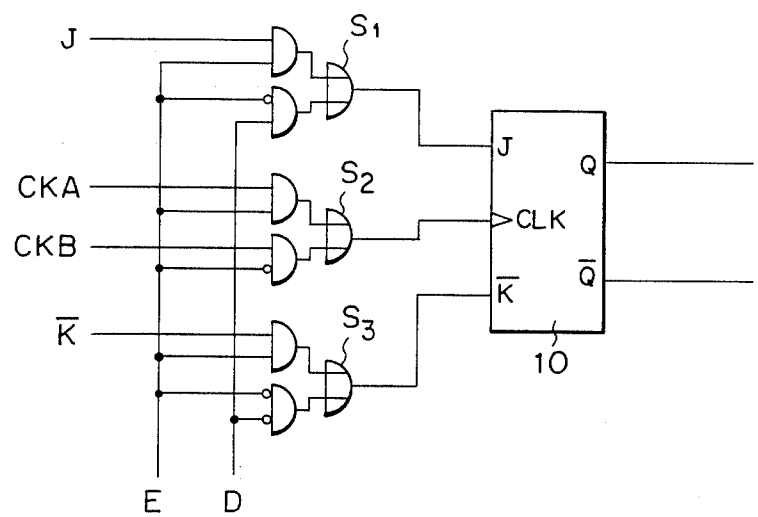
FIG. 12 is a logic circuit diagram illustrating a conventional logic circuit including a data loading function.

FIG. 12 is a logic circuit diagram illustrating a conventional logic circuit including the J-$\overline{K}$ flip-flop shown in FIG. 10 or 11 and a switching circuit. In FIG. 11, 10 is the J-$\overline{K}$ flip-flop; $S_1$ to $S_3$ represent switches; CKA is a clock signal for normal operation as a J-$\overline{K}$ flip-flop; CKB is a test clock signal for data loading operation; D is a test data; and E is an enable signal.

When the enable signal E is at the H level, the inputs J and $\overline{K}$ and the clock signal CKA are selected by the switch circuits $S_1$ to $S_3$ so as to carry out a usual J-$\overline{K}$ flip-flop operation. When the enable signal E is turned to the L level, the test clock signal CKB and the test data D are selected so as to perform a test operation.

Where a logic circuit includes a multi-stage connection of flip-flops, each flip-flop consisting of the switch circuits $S_1$ to $S_3$ and the J-$\overline{K}$ flip-flop 10 shown in FIG. 12, the input data J and $\overline{K}$ are supplied from outputs Q and $\overline{Q}$ of a pre-stage flip-flop (not shown in FIG. 12).

Since the switches $S_1$ to $S_3$ are complex, the logic circuit shown in FIG. 12 has a disadvantage regarding integration, and when a number of flip-flops are to be connected, this disadvantage will become more serious. Further, since the switches $S_1$ to $S_3$ are provided externally of the J-$\overline{K}$ flip-flop 10, the conventional J-$\overline{K}$ flip-flop 10 itself does not have a data loading function.

Embodiments of the present invention will be now described in the following.

Figure 1:
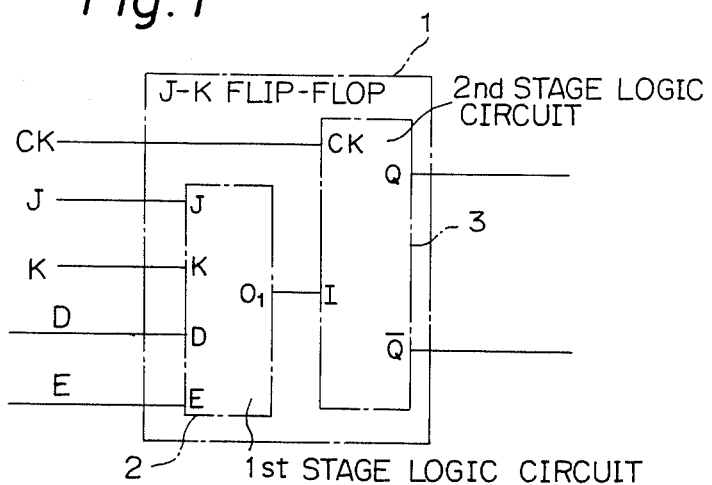
FIG. 1 is a block diagram illustrating a logic circuit according to an embodiment of the present invention.

FIG. 1 shows a logic circuit according to an embodiment of the present invention. In FIG. 1, the logic circuit includes a J-K flip-flop 1. The J-K flip-flop includes a first-stage logic circuit 2 and a second-stage logic circuit 3.

The first-stage logic circuit 2 has a first input terminal J for receiving a first input data J, a second input terminal K for receiving a second input data K, a test date terminal D for receiving a test data D, an enable terminal E for receiving an enable signal E, and an output $O_1$.

The second-stage logic circuit 3 has an input I connected to the output $O_1$ of the first-stage logic circuit 2. The circuit 3 further has a clock signal input terminal CK, a noninverted signal output terminal Q, and an inverted signal output terminal $\overline{Q}$.

The first-stage logic circuit 2 operatively selects, in response to the enable signal E applied to the enable terminal E, either the test data D or the first and second input data J and K. The selected data is latched in the second-stage logic circuit in response to the clock signal terminal CK.

Figure 2:
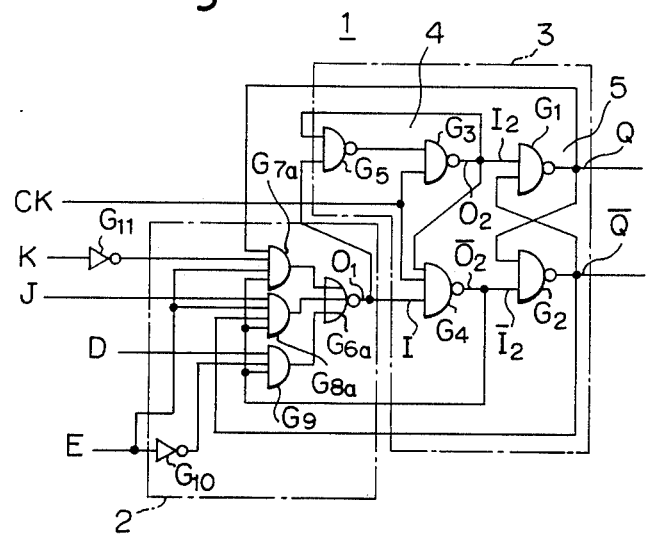
FIG. 2 is a logic circuit diagram illustrating in detail the logic circuit shown in FIG. 1.

FIG. 2 shows in more detail the logic circuit 1 shown in FIG. 1.

In FIG. 2, the second-stage logic circuit 2 includes a pre-stage logic circuit 4 consisting of NAND gates $G_3$ to $G_5$ and a final-stage logic circuit 5 consisting of NAND gates $G_1$ and $G_2$. These NAND gates $G_1$ to $G_5$ are the same as those in the conventional J-$\overline{K}$ flip-flop shown in FIG. 10. The output $Q_1$ of the first-stage logic circuit 2 is connected to the input I of the pre-stage logic circuit 4. The outputs $O_2$ and $\overline{O}_2$ of the pre-stage logic circuit 4 are connected to the inputs $I_2$ and $\overline{I}_2$ of the final-stage logic circuit 5. The outputs of the final-stage logic circuit 5 are respectively connected to the noninverted signal output terminal Q and to the inverted signal output terminal $\overline{Q}$.

The first-stage logic circuit 2 includes a NOR gate $G_{6a}$, a first AND gate $G_{7a}$, a second AND gate $G_{8a}$, and a third AND gate $G_9$. The first NAND gate $G_{7a}$ has four inputs respectively connected to the noninverted signal output terminal Q, to the second input terminal K through an inverter $G_{11}$, to the enable terminal E, and to one of the outputs $O_2$, of the pre-stage logic circuit. The second AND gate $G_{8a}$ has four inputs respectively connected to the first input terminal J, to the enable terminal E, to the inverted signal output terminal $\overline{Q}$, and to the output $\overline{O}_2$ of the pre-stage logic circuit. The third AND gate $G_9$ has three inputs respectively connected to the test data terminal D, to the enable terminal E through an inverter $G_{10}$, and to the output $\overline{O}_2$ of the pre-stage logic circuit 4. The NOR gate $G_{6a}$ has three inputs respectively, connected to the outputs of the first, second, and third AND gates, $G_{7a}$, $G_{8a}$ and $G_9$, and has the output $O_1$ connected to the input I of the second-stage logic circuit 3.

The NAND gates $G_1$ and $G_2$ in the final-stage logic circuit 5 are cross-coupled to each other. In the pre-stage logic circuit 4, the NAND gate $G_3$ has two inputs and an output; the NAND gate $G_4$ has three inputs and an output; and the NAND gate $G_5$ has two inputs and an output. The input I is connected to one input of the NAND gate $G_4$ and to one input of the NAND gate $G_5$. The output of the NAND gate $G_3$ is connected to the input $I_2$ of the NAND gate $G_1$, to the other input of the NAND gate $G_5$ and to the other input of the NAND gate $G_4$. The output of the NAND gate $G_5$ is connected to one input of the NAND gate $G_3$. The clock signal terminal CK is connected to the other input of the NAND gate $G_3$ and to another input of the NAND gate $G_4$. The output of the NAND gate $G_4$ is connected to the other input of the NAND gate $G_2$.

Figure 3:
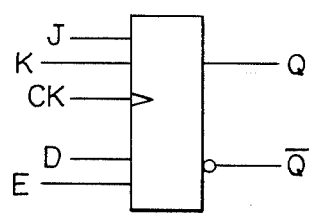
FIG. 3 is a block diagram illustrating a symbol marking of the logic circuit shown in FIG. 1 or in FIG. 2.

The symbol marking of this J-K flip-flop with the date loading function shown in FIG. 1 or FIG. 2 is illustrated in FIG. 3.

To explain the operation of the logic circuit shown in FIG. 2, usual operations as a J-K flip-flop in a counter or a shift register are carried out by raising the potential of the enable signal E to the H level. In this state, the AND gates $G_{7a}$ and $G_{8a}$ are opened to pass the first and the second input data J and K and the AND gate $G_9$ is closed so that input of the test data D is inhibited. Therefore, by the clock signal CK and the input data J and K, the logic circuit operates in the same way as the beforementioned conventional J$\overline{K}$ flip-flop.

When the test data is to be loaded, it is necessary to turn the enable signal E to the L level. This closes the AND gates $G_{7a}$ and $G_{8a}$ so as to inhibit passage of the input data J and K therethrough; and the AND gate $G_9$ is opened so that the test data D passes through the AND gate $G_9$ and the NOR gate $G_{6a}$ to be input to the NAND gates $G_4$ and $G_5$ at the input stage of the pre-stage logic circuit 4. Thus, instead of the first and second input data J and K, the test data D is input to the J-K flip-flop. Therefore, the outputs Q and $\overline{Q}$ of the J-K flip-flop are determined by the test data D. That is, the test data D is loaded into the flip-flop.

When a serial shift register or a binary counter is formed by connecting a number of flip-flops each consisting of the J-K flip-flop such as shown in FIG. 2, the test data D is supplied from the output Q or $\overline{Q}$ of a pre-stage J-K flip-flop not shown in FIG. 2.

Figure 4:
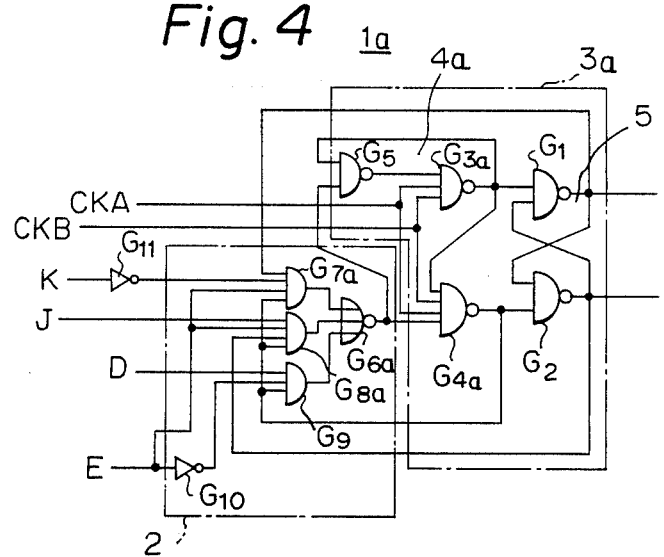
FIG. 4 is a logic circuit diagram illustrating a logic circuit according to another embodiment of the present invention.

FIG. 4 shows a logic circuit according to a second embodiment of the present invention. The difference between FIG. 2 and FIG. 4 is that, in place of the single clock signal CK in FIG. 2, two clock signals CKA and CKB are supplied to the J-K flip-flop shown in FIG. 4. Because of this difference, the NAND gate $G_{3a}$ has three inputs; and the NAND gate $G_{4a}$ has four inputs. The clock signals CKA and CKB are supplied to the NAND gates $G_{3a}$ and $G_{4a}$. The clock signal CKA is used for a usual J-K flip-flop operation, and the clock signal CKB is used for loading the test data D.

In a synchronous logic circuit, it is not always necessary to include the two clock signals. However, in an asynchronous logic circuit such as a binary counter, two clock signals are indispensable for loading the test data D.

Figure 5:
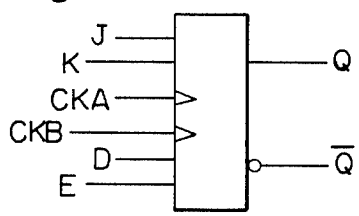
FIG. 5 is a block diagram illustrating a symbol marking of the logic circuit shown in FIG. 4.

FIG. 5 shows the symbol marking of the logic circuit shown in FIG. 4.

If the inverter gate $G_{11}$ is omitted, the logic circuit shown in FIG. 2 or FIG. 4 will become a J-$\overline{K}$ flip-flop.

Figure 6:
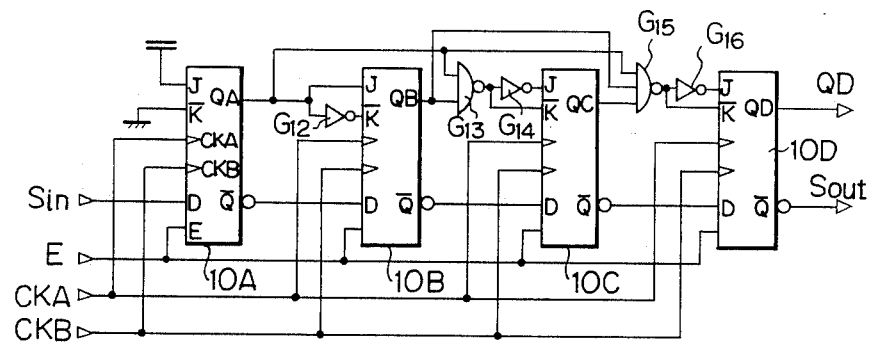
FIG. 6 is a logic circuit diagram illustrating a logic circuit according to still another embodiment of the present invention.

FIG. 6 shows an example of a four-bit binary counter constructed by J-$\overline{K}$ flip-flops each consisting of a logic circuit such as shown in FIG. 4 except that the inverter gate $G_{11}$ is omitted. In FIG. 6, 10A to 10D are the above-mentioned J-$\overline{K}$ flip-flops with data loading functions. The first input data J of the first stage flip-flop 10A is fixed at the H level and the second input data K is fixed at the L level. The first input terminal J of the second-stage flip-flop 10B is connected to the noninverted output terminal QA of the first-stage slip-flop 10A. The second input terminal $\overline{K}$ of the flip-flop 10B is connected through an inverter $G_{12}$ to the first input terminal J. The second input $\overline{K}$ of the third-stage flip-flop 10C is a NAND of the noninverted output QA of the first-stage flip-flop 10A and the noninverted output QB of the second-stage flip-flop 10B; and the first input terminal J is an inversion thereof. The second input terminal $\overline{K}$ of the fourth-stage flip-flop 10D is a NAND of the noninverted output QA of the first-stage flip-flop 10A, the noninverted output QB of the second stage 10B and the noninverted output QC of the third stage 10C, and the first input is the inversion thereof. $G_{13}$ and $G_{15}$ are the NAND gates; and $G_{12}$, $G_{14}$ and $G_{16}$ are inverters. The test data terminal D of the first-stage flip-flop 10A receives a test signal Sin; and the test data terminals D of the second-stage and the subsequent flip-flops are the inverted outputs of the pre-stage flip-flops.

Figures 7A, 7B, 7C, 7D, 7E, 7F, 7G, 7H:
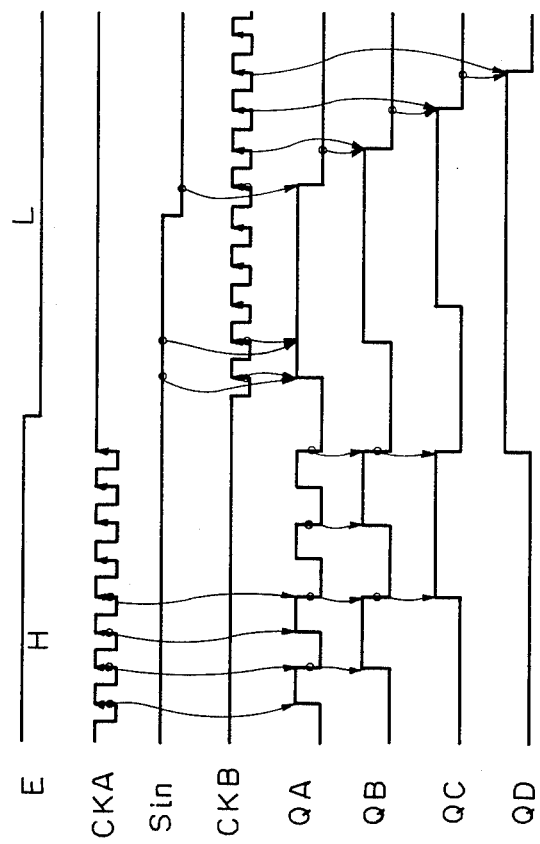
FIGS. 7A through 7H show a time chart explaining the operation of the logic circuit shown in FIG. 6.

The operation of the binary counter shown in FIG. 6 is explained with reference to a time chart shown in FIGS. 7A through 7H. When the enable signal E shown in FIG. 7A is at the H level, J and $\overline{K}$ inputs are valid so that a usual counter mode is effected in which, since the J input of the first-stage flip-flop 10A is "1" and the $\overline{K}$ input is "0", the noninverted output QA is inverted every time the clock signal CKA rises as shown in FIG. 7E. In the second-stage flip-flop 10B, the J input is the same as the output QA and the $\overline{K}$ input is the inversion of the J input. Therefore, when the QA is "1", the output QB is inverted every time the clock signal CKA rises, and when the QA is "0", the output QB is not changed even when the clock signal CKA rises, as shown in FIG. 7E. In the third-stage flip-flop 10C, when the outputs QA and QB are both at the high level H, the J input of the flip-flop 10C becomes "1" so that the noninverted output QC thereof is inverted by the rise of the clock signal CKA as shown in FIG. 7G. In the same way, in the fourth-stage flip-flop 10D, the noninverted output QD becomes as shown in FIG. 7F. As will be apparent from these outputs QA to QD, the flip-flops 10A to 10D constitute a binary counter.

Next, when the enable signal E is turned to the L level, the D inputs of these flip-flops 10A to 10C become valid so that a test mode is effected. In the test mode, the test clock signal CKB is supplied to the binary counter. An explanation of this is given with reference to the time chart shown in FIGS. 7A to 7H. When the input test data Sin is at the H level, the output QA of the first-stage flip-flop 10A is turned to the H level by the rise of the test clock signal CKB, and is kept in this state from thereon. The outputs QB, QC, . . . of the flip-flops of the second-stage, third-stage, . . . are made H by the second, the third, . . . rises of the test clock signal CKB, and are kept in these states from thereon. When the input test data Sin is turned to the L level, the output QA is turned to the L level by the rise of the test clock signal CKB; the QB is turned to the L level by the next rise of the test clock signal CKB; and so forth, so that the test data Sin here at the H level) is shifted by one stage of flip-flops each time the test clock signal CKB rises, as illustrated in FIGS. 7A to 7H.

In operation as a counter, $2^m$ clocks are necessary to change the output of the m-stage flip-flop (m=1, 2, 3, . . . ). By contrast, in the test mode of operation, only m clocks are necessary to change the output of the m-stage flip-flop. Accordingly, the test mode is suitable when data is to be input from the first-stage input to the m-stage of a number of flip-flops connected in cascade.

In the embodiment shown in FIG. 6, the two clock signals CKA and CKB may be replaced by the single clock signal CK, according to an embodiment of the present invention. In this case, the flip-flops 10A to 10D should be replaced by the flip-flops which are identical with the J-$\overline{K}$ flip-flop 1a shown in FIG. 4 except that the inverter $G_{11}$ is omitted.

For general purposes, however, it is convenient to provide the two clock signals CKA and CKB which are independent on each other, because many logic circuits are asynchronous.

Figure 8:
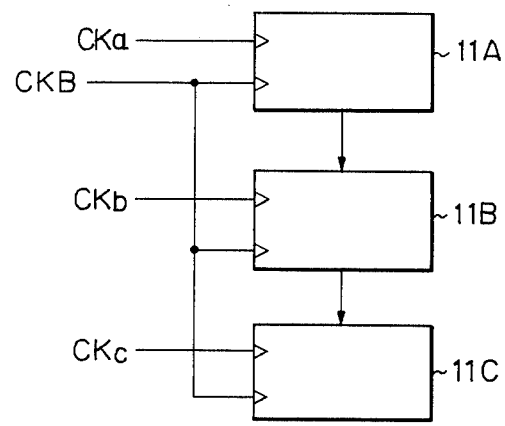
FIG. 8 is a block diagram illustrating an asynchronous logic unit according to a still further embodiment of the present invention.

FIG. 8 shows an example of an asynchronous logic unit. In FIG. 8, logic circuits 11A through 11C are operated by clock signals $CK_a$, $CK_b$, and $CK_c$, respectively. These clock signals $CK_a$ to $CK_c$ are different from each other. The output of the logic circuit 11A is connected to the input of the logic circuit 11B, and the output of the logic circuit 11B is connected to the logic circuit 11C. Thus, the logic circuits 11A through 11C constitute an asynchronous logic unit.

To effect the above-mentioned test mode operation, a common clock signal is necessary. Therefore, the test clock signal CKB is commonly supplied to these logic circuits 11A to 11C.

Figure 9:
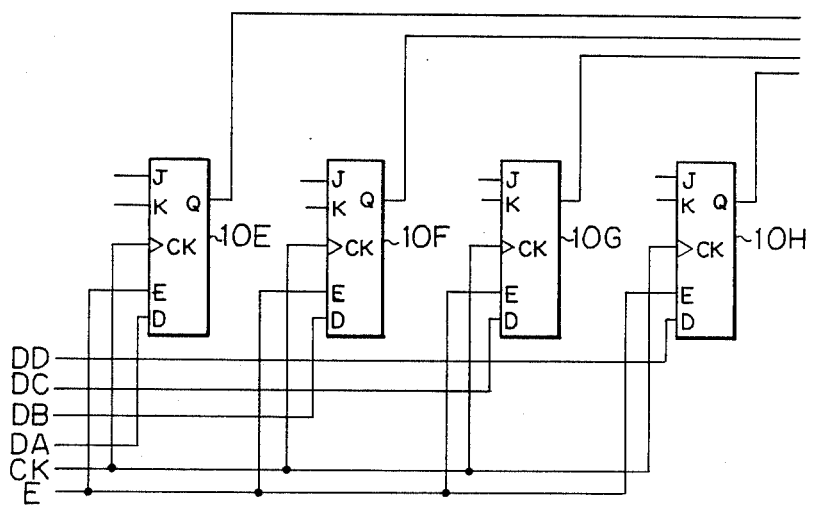
FIG. 9 is a logic circuit diagram illustrating a logic circuit according to a still further embodiment of the present invention.

FIG. 9 shows a synchronous logic circuit according to a still another embodiment of the present invention. In FIG. 9, each of the flip-flops 10E to 10H is the same as the J-K flip-flop shown in FIG. 2 having the single clock signal terminal CK. Test data DA to DD are independently supplied to the respective flip-flops 10E to 10H; the enable signal E is commonly supplied to these flip-flops; and the outputs Q of the flip-flops are inspected in parallel in the test mode. Thus, to test each flip-flop, no additional switching circuit is necessary externally of the flip-flop.

As described above, according to the present invention, since a J-K flip-flop has a data loading function, a serial shift register circuit can be constructed so that a test of a complex logic circuit can be easily carried out. Accordingly, a fault diagnosis of a logic circuit is easy and thus a highly reliable circuit can be provided. Also, since the switching circuit for the data loading is simple, the flip-flop circuit as a whole can be constructed to be small and the integration degree can be increased. Further, since the number of logic gates is reduced, the delay time of both the usual operation and the test operation is shortened.

It should be noted that the difference between the J-K flip-flop and the J-$\overline{K}$ flip-flop is not essential in the present invention. Further, the present invention is not restricted to the edge-trigger type flip-flop. Any type of J-K flip-flop may be applicable to the present invention.

Still further, the logic circuit according to the present invention is not restricted to a counter or a shift register. Any logic circuit including J-K flip-flops may be applicable to the present invention.

I claim:

1. A logic circuit having a test data loading function, comprising at least one J-K flip-flop;

said J-K flip flop comprising:

a first-stage logic circut having a first input terminal for receiving a first input data, a second input terminal for receiving a second input data, a test data terminal for receiving a test data, an enable terminal for receiving an enable signal, and an output; and a second-stage logic circuit having an input connected to the output of said first-stage logic circuit and further having a clock signal input terminal for receiving a clock signal, a noninverted signal output terminal, and an inverted signal output terminal;

means for providing an enable signal, first and second data signals and a test data signal such that said enable signal has a first constant value when said first input data or said second input data is received and said enable signal has a second constant value when said test data is received, said first-stage logic circuit operatively selecting, in response to said enable signal applied to said enable terminal, either of said test data or said first and second input data, the selected data being latched in said second-stage logic circuit in response to said clock signal applied to said clock signal terminal.

2. A logic circuit as set forth in claim 1, wherein said second-stage logic circuit comprises a pre-stage logic circuit and a final-stage logic circuit, the output of said first-stage logic circuit being connected to an input of said pre-stage logic circuit, outputs of said pre-stage logic circuit being connected to inputs of said final-stage logic circuit, and outputs of said final-stage logic circuit being respectively connected to said noninverted signal output terminal and to said inverted signal output terminal.

3. A logic circuit as set forth in claim 2, wherein said first-stage logic circuit comprises:

a first AND gate having four inputs respectively connected to said noninverted signal output terminal, to said second input terminal through an inverter, to said enable terminal, and to one of the outputs of said pre-stage logic circuit;

a second gate having four inputs respectively connected to said first input terminal, to said enable terminal, to said inverted signal output terminal, and to said one of the outputs of said pre-stage logic circuit;

a third gate having three inputs respectively connected to said test data terminal, to said enable terminal through an inverter, and to said one of the outputs of said pre-stage logic circuit; and a forth gate having three inputs respectively connected to the outputs of said first, second and third gates and having an output connected to said input of said second-stage logic circuit.

4. A logic circuit as set forth in claim 2, wherein said final-stage logic circuit comprises cross-coupled first and second gates, and said pre-stage logic circuit comprises a third gate having two inputs and an output, a fourth gate having three inputs and an output, and a fifth gate having two inputs and output, said clock signal terminal being connected to one of the inputs of said third gate and to one of the inputs of said fourth gate, the output of said first-stage logic circuit being connected to another one of the inputs of said third gate and to another one of the inputs of said fourth gate, the output of said third gate being connected to still another one of the inputs of said fourth gate and to another one of the inputs of said fifth gate.

5. A logic circuit having a test data loading function comprising at least one J-K flip-flop;

said J-K flip-flop comprising:

a first-stage logic circuit having a first input terminal for receiving a first input data, a second input terminal for receiving a second input data, a test data terminal for receiving a test data, an enable terminal for receiving an enable signal, and an output; and a second-stage logic circuit having an input connected to the output of said first-stage logic circuit and further having a first clock signal input terminal for receiving a first clock signal, a second clock signal input terminal for receiving a second clock signal, noninverting output terminal, and an inverted signal output terminal;

means for providing an enable signal, first and second data signals and a test data signal such that said enable signal has a first constant value when said first input data or said second input data is received, and said enable signal has a second constant value when said test data is received, said first-stage logic circuit operatively selecting, in response to said enable signal applied to said enable terminal, either of said test data or said first and second input data, the selected input data being latched in said second-stage logic circuit in response to said first clock signal applied to said first clock signal terminal, and the selected test data being latched in said second-stage logic circuit in response to said second clock signal applied to said second clock signal terminal.

6. A logic circut as set forth in claim 5, wherein said second-stage logic circuit comprises a pre-stage logic circuit and a final-stage logic circuit, the output of said first-stage logic circuit being connected to an input of said pre-stage logic circuit, outputs of said pre-stage logic circuit being connected to inputs of said final-stage logic circuit, and outputs of said final-stage logic circuit being respectively connected to said noninverted signal output terminal and to said inverted signal output terminal.

7. A logic circuit as set forth in claim 6, wherein said first-stage logic circuit comprises:

a first gate having four inputs respectively connected to said noninverted signal output terminal, to said second input terminal through an inverter, to said enable terminal, and to one of the outputs of said pre-stage logic circuit;

a second gate having four inputs respectively connected to said first input terminal, to said enable terminal, to said inverted signal output terminal, and to said one of the outputs of said pre-stage logic circuit;

a third gate having three inputs respectively connected to said test data terminal, to said enable terminal through an inverter, and to said one of the outputs of said pre-stage logic circuit; and a fourth gate having three inputs respectively connected to the outputs of said first, second and third gates, and having an output connected to said input of said second-stage logic circuit.

8. A logic circuit as set forth in claim 6, wherein said final-stage logic circuit comprises cross-coupled first and second gates, and said pre-stage logic circuit comprises a third gate having three inputs and an output, a fourth gate having four inputs and an output, and a fifth gate having two inputs and an output, said first and second clock signal terminals respectively being connected to two of the inputs of said third gate and to two of the inputs of said fourth gate, the output of said first-stage logic circuit being connected to another one of the inputs of said third gate and to another one of the inputs of said fourth gate, the output of said third gate being connected to still another one of the inputs of said fourth gate and to another one of the inputs of said fifth gate.

9. A logic circuit as set forth in claim 1 comprising a synchronous logic unit including a plurality of flip-flops, each of said flip-flops being constituted by said J-K flip-flop, all of said clock signal terminals being commonly connected, and all of said enable terminals being commonly connected.

10. A logic circuit as set forth in claim 5 comprising an asynchronous logic unit including a plurality of flip-flops, each of said flip-flops being constituted by said J-K flip-flop, all of said second clock signal terminals being commonly connected, and all of said enable terminals being commonly connected.

11. A logic circuit having a test data loading function, comprising at least one J-K flip-flop; said J-K flip flop comprising:
a first-stage logic circuit having a first input terminal for receiving a first input data, a second input terminal for receiving a second input data, a test data terminal for receiving a test data, an enable terminal for receiving an enable signal, and an output; and
a second-stage logic circuit having an input connected to the output of said first-stage logic circuit and further having a clock signal input terminal for receiving a clock signal, a noninverted signal output terminal, and an inverted signal output terminal, wherein said second-stage logic circuit comprises a pre-stage logic circuit and a final-stage logic circuit, the output of said first-stage logic circuit being connected to an input of said pre-stage logic circuit, the outputs of said pre-stage logic circuit being connected to inputs of the final-shape logic circuit, and the outputs of said final-stage logic circuit being respectively connected to said noninverted signal output terminal and to said inverted signal output terminal;
said first-stage logic circuit further comprises
a first gate having four inputs respectively connected to said noninverted signal output terminal, to said second input terminal through an inverter, to said enable terminal, and to one of the outputs of said pre-stage logic circuit,
a second gate having four inputs respectively connected to said first input terminal, to said enable terminal, to said inverted signal output terminal, and to said one of the outputs of said pre-stage logic circuit,
a third gate having three inputs respectively connected to said test data terminal, to said enable terminal through an inverter, and to said one of the outputs of said pre-stage logic circuit, and
a fourth gate having three inputs respectively connected to the outputs of said first, second and third gates and having an output connected to said input of said second-stage logic circuit;
said first-stage logic circuit operatively selecting, in response to said enable signal applied to said enable terminal, either of said test data or said first and second input data, the selected data being latched in said second-stage logic circuit in response to said clock signal applied to said clock signal terminal.

12. A logic circuit having a test data loading function, comprising at least one J-K flip-flop; said J-K flip flop comprising:
a first-stage logic circuit having a first input terminal receiving a first input data, a second input terminal for receiving a second input data, a test data terminal for receiving a test data, an enable terminal for receiving an enable signal, and an output; and
a second-stage logic circuit having an input connected to the output of said first-stage logic circuit and further having a clock signal input terminal for receiving a clock signal, a noninverted signal output terminal, and an inverted signal output terminal, wherein said second-stage logic circuit comprises a pre-stage logic circuit and a final-stage logic circuit, the output of said first-stage logic circuit being connected to an input of said pre-stage logic circuit, the outputs of said pre-stage logic circuit being connected to inputs of said final-stage logic circuit, and outputs of said final-stage logic circuit being respectively connected to said noninverted signal output terminal and to said inverted signal output terminal;
said final-stage logic circuit comprises cross-coupled first and second gates, and said pre-stage logic circuit comprises a third gate having two inputs and an output, a fourth gate having three inputs and an output, and a fifth gate having two inputs and an output, said clock signal terminal being connected to one of the inputs of said third gate and to one of the inputs of said fourth gate, the output of said first-stage logic circuit being connected to another one of the inputs of said third gate and to another one of the inputs of said fourth gate, the output of said third gate being connected to still another one of the inputs of said forth gate and to another one of the inputs of said fifth gate;
said first-stage logic circuit operatively selecting, in response to said enable signal applied to said enable terminal, either of said test data or said first and second input data, the selected data being latched in said second-stage logic circuit in response to said clock signal applied to said clock signal terminal.

13. A logic circuit having a test data loading function comprising at least one J-K flip-flop; said J-K flip-flop comprising:
a first-stage logic circuit having a first input terminal for receiving a first input data, a second input terminal for receiving a second input data, a test data terminal for receiving a test data, an enable terminal for receiving an enable signal, and an output; and
a second-stage logic circuit having an input connected to the output of said first-stage logic circuit and further having a first clock signal input terminal for receiving a first clock signal, a second clock signal input terminal for receiving a second clock signal, noninverting output terminal, and an inverted signal output terminal, wherein said second-stage logic circuit comprises a pre-stage logic circuit and a final-stage logic circuit, the output of said first-stage logic circuit being connected to an input of said pre-stage logic circuit, outputs of said pre-stage logic circuit being connected to inputs of said final-stage logic circuit, and outputs of said final-stage logic circuit being respectively connected to said noninverted signal output terminal and to said inverted signal output terminal;

said first-stage logic circuit further comprises
- a first gate having four inputs respectively connected to said noninverted signal output terminal, to said second input terminal through an inverter, to said enable terminal, and to one of the outputs of said pre-stage logic circuit,
- a second gate having four inputs respectively connected to said first input terminal, to said enable terminal, to said inverted signal output terminal, and to said one of the outputs of said pre-stage logic circuit;
- a third gate having three inputs respectively connected to said test data terminal, to said enable terminal through an invertor, and to said one of the outputs of said pre-stage logic circuit, and
- a fourth gate having three inputs respectively connected to the outputs of said first, second and third gates, and having an output connected to said input of said second-stage logic circuit;

said first-stage logic circuit operatively selecting, in response to said enable signal applied to said enable terminal, either of said test data or said first and second input data, the selected input data being latched in said second-stage logic circuit in response to said first clock signal applied to said first clock signal terminal, and the selected test data being latched in said second-stage logic circuit in response to said second clock signal applied to said second clock signal terminal.

14. A logic circuit having a test data loading function comprising at least one J-K flip-flop;
said J-K flip-flop comprising:
a first-stage logic circuit having a first input terminal for receiving a first input data, a second input terminal for receiving a second input data, a test data terminal for receiving a test data, an enable terminal for receiving an enable signal, and an output; and a second-stage logic circuit having an input connected to the output of said first-stage logic circuit and further having a first clock signal input terminal for receiving a first clock signal, a second clock signal input terminal for receiving a second clock signal, noninverting output terminal, and an inverted signal output terminal, wherein said second-stage logic circuit comprises a pre-stage logic circuit and a final-stage logic circuit, the output of said first-stage logic circuit being connected to an input of said pre-stage logic circuit, outputs of said pre-stage logic circuit being connected to inputs of said final-stage logic circuit, and outputs of said final-stage logic circuit being respectively connected to said noninverted signal output terminal and to said inverted signal output terminal;

said final-stage logic circuit comprises cross-coupled first and second gates, and said pre-stage logic circuit comprises a third gate having three inputs and an output, a fourth gate having four inputs and an output, and a fifth gate having two inputs and an output, said first and second clock signal terminals respectively being connected to two of the inputs of said third gate and to two of the inputs of said fourth gate, the output of said first-stage logic circuit being connected to another one of the inputs of said third gate and to another one of the inputs of said fourth gate, the output of said third gate being connected to still another one of the inputs of said fourth gate and to another one of the inputs of said fifth gate;

said first-stage logic circuit operatively selecting, in response to said enable signal applied to said enable terminal, either of said test data or said first and second input data, the selected input data being latched in said second-stage logic circuit in response to said first clock signal applied to said first clock signal terminal, and the selected test data being latched in said second-stage logic circuit in response to said second clock signal applied to said second clock signal terminal.

* * * * *